US010439388B2

(12) United States Patent
Suda et al.

(10) Patent No.: US 10,439,388 B2
(45) Date of Patent: Oct. 8, 2019

(54) ELECTRICAL MOTOR COIL SHORT DETECTION AND PROTECTION (71) Applicant: Eaton Intelligent Power Limited, Dublin (IE)

(72) Inventors: Bharath Kumar Suda, Pune (IN); James David, Portage, MI (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 16/082,129

(22) PCT Filed: Mar. 3, 2017

(86) PCT No.: PCT/US2017/020643
§ 371 (c)(1),
(2) Date: Sep. 4, 2018

(87) PCT Pub. No.: WO2017/152040
PCT Pub. Date: Sep. 8, 2017

(65) Prior Publication Data
US 2019/0074682 A1 Mar. 7, 2019

(30) Foreign Application Priority Data
Mar. 3, 2016 (IN) .............................. 201611007578

(51) Int. Cl.
*H02H 7/08* (2006.01)
*G01R 31/34* (2006.01)
(Continued)

(52) U.S. Cl.
CPC ..... *H02H 7/0833* (2013.01); *G01R 19/16547* (2013.01); *G01R 31/346* (2013.01);
(Continued)

(58) Field of Classification Search
CPC ........ H02M 2001/0009; H02M 7/5395; H02P 6/182; H02P 6/10; H02P 7/282
See application file for complete search history.

(56) References Cited

U.S. PATENT DOCUMENTS 5,623,190 A    4/1997   Tajima et al.
6,791,852 B2   9/2004   Carter et al.
(Continued)

FOREIGN PATENT DOCUMENTS

JP    2000-228891 A      8/2000
KR    10-2012-0006308 A  1/2012

OTHER PUBLICATIONS

International Search Report and Written Opinion dated May 30, 2017 for PCT/US2017/020643; pp. 1-8.

*Primary Examiner* — Shawki S Ismail
*Assistant Examiner* — Zoheb S Imtiaz
(74) *Attorney, Agent, or Firm* — Mei & Mark, LLP (57) ABSTRACT A fault detection method for a multi-phase motor system applies a first duty cycle to first phase coil windings and applies a second duty cycle to second phase coil windings. The second duty cycle differs from the first duty cycle by a first difference value D1. A first current I1 is measured. A third duty cycle is applied to third phase coil windings and a fourth duty cycle is applied to the second phase coil windings. The fourth duty cycle differs from the third duty cycle by a second difference value D2. A second current I2 is measured. Line-to-line resistances R1, R2 are calculated using the difference values D1, D2, the measured currents I1, I2, and a measured DC voltage VDC. After determining a resistance difference ΔR between the line-to-line resistances R1, R2, a comparison to a first non-zero threshold T1 indicates a fault.

16 Claims, 5 Drawing Sheets (51) Int. Cl.
*G01R 19/165* (2006.01)
*H02P 29/024* (2016.01)
*G01R 27/02* (2006.01)

(52) U.S. Cl.
CPC ............. *H02H 7/08* (2013.01); *H02P 29/027* (2013.01); *G01R 27/02* (2013.01)

(56) References Cited

U.S. PATENT DOCUMENTS

| | | |
|---|---|---|
| 7,586,285 B2 | 9/2009 | Gunji |
| 7,948,205 B2 | 5/2011 | Gunji |
| 8,013,564 B2 | 9/2011 | Gunji |
| 8,633,664 B2 | 1/2014 | Endoh |
| 9,350,277 B2 | 5/2016 | Lee et al. |
| 2003/0155880 A1* | 8/2003 | Iwanaga .................. H02P 6/10 318/432 |
| 2007/0211396 A1 | 9/2007 | Gunji |
| 2009/0066286 A1 | 3/2009 | Gunji |
| 2009/0073617 A1 | 3/2009 | Gunji |
| 2011/0221369 A1* | 9/2011 | Welchko ............. H02P 29/0241 318/400.22 |
| 2011/0234138 A1 | 9/2011 | Kuratani et al. |
| 2012/0235622 A1* | 9/2012 | Welchko ............... B60L 3/0038 318/722 |
| 2015/0349675 A1 | 12/2015 | Lee et al. |

\* cited by examiner

ELECTRICAL MOTOR COIL SHORT DETECTION AND PROTECTION

This is a § 371 National Stage Entry of Application No. PCT/US2017/020643, filed Mar. 3, 2017, and claims the benefit of Indian provisional application for letters patent No. 201611007578, filed Mar. 3, 2016, all of which are incorporated herein by reference.

FIELD

This application relates to methods for detecting an electric motor coil short to provide system protection.

BACKGROUND

With the increasing trend of vehicle electrification, more and more electric actuators, especially electric motors are finding their way in to vehicles. These electric motors can get exposed to very high vibration levels, up to 14 Grms, which could result in motor coil rubbing and shorting. This results in degraded motor performance and in some cases loss of functionality depending on the level of coil short. Detecting this type of short, and taking action based on the detected fault, eliminates consequences of the fault.

SUMMARY

The systems and methods disclosed herein overcome the above disadvantages and improves the art by way of a motor system, which comprises a DC source, an inverter, and a multi-phase motor. A method applies a first duty cycle to first phase coil windings and applies a second duty cycle to second phase coil windings. The second duty cycle differs from the first duty cycle by a first difference value D1. A first current I1 is measured. A third duty cycle is applied to third phase coil windings and a fourth duty cycle is applied to the second phase coil windings. The fourth duty cycle differs from the third duty cycle by a second difference value D2. A second current I2 is measured. Line-to-line resistances R1, R2 are calculated using the difference values D1, D2, the measured currents I1, I2, and a measured DC voltage VDC. After determining a resistance difference ΔR between the line-to-line resistances R1, R2, a comparison to a first non-zero threshold T1 indicates a fault.

The method can further comprise selecting between a disabled motor mode, wherein the motor operation is terminated, and a degraded motor operation mode, wherein the motor operation is limited to less than a nominal capacity based on the resistance difference ΔR or based on differences between the line-to-line resistances R1, R2 and a nominal resistance RN.

Additional objects and advantages will be set forth in part in the description which follows, and in part will be obvious from the description, or may be learned by practice of the disclosure. The objects and advantages will also be realized and attained by means of the elements and combinations particularly pointed out in the appended claims.

It is to be understood that both the foregoing general description and the following detailed description are exemplary and explanatory only and are not restrictive of the claimed invention.

DETAILED DESCRIPTION

Reference will now be made in detail to the examples which are illustrated in the accompanying drawings. Wherever possible, the same reference numbers will be used throughout the drawings to refer to the same or like parts. Directional references such as "left" and "right" are for ease of reference to the figures.

Figure 1A:
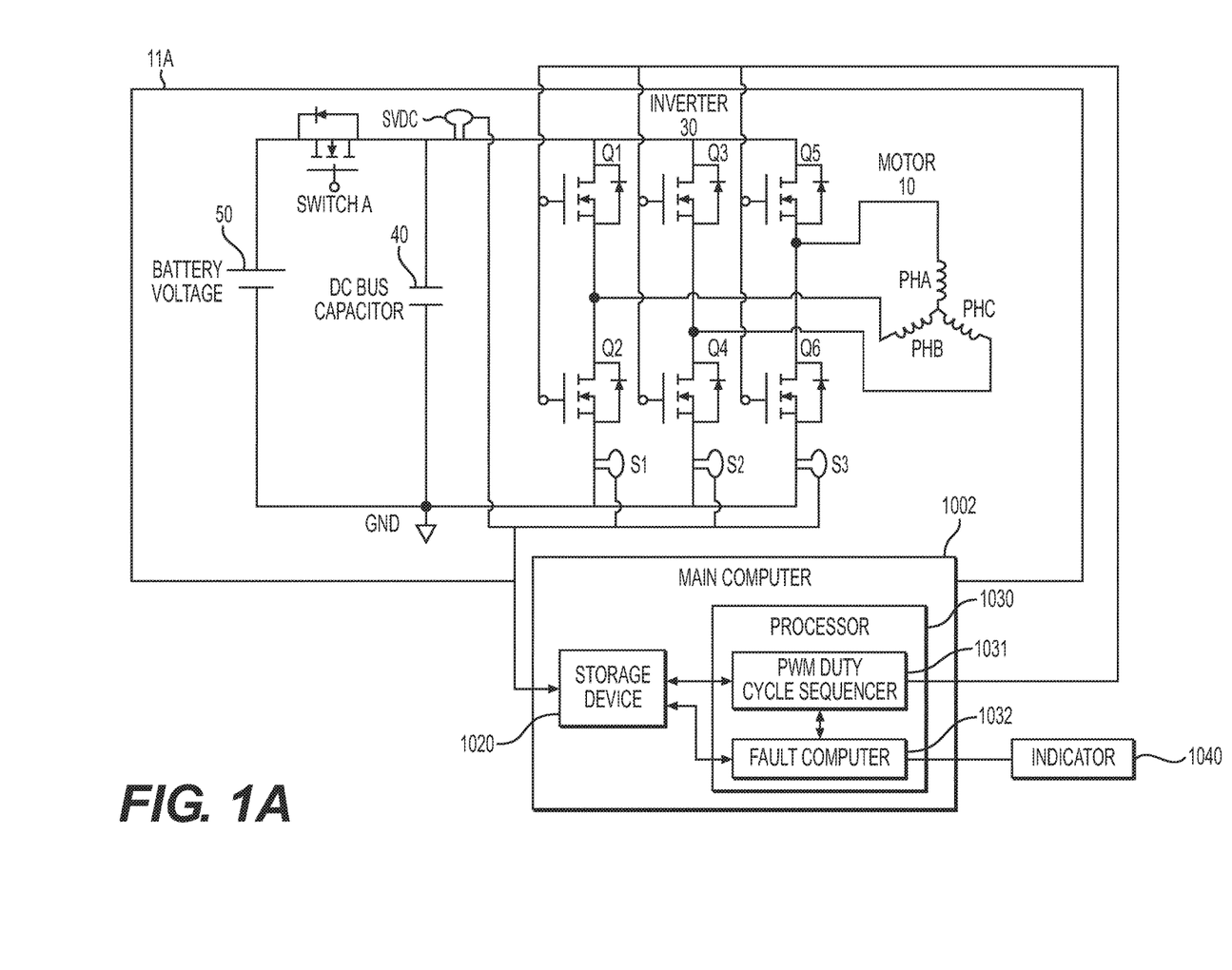
FIGS. 1A & 1B are schematics of exemplary 3-phase motor circuits.
Figure 1B:
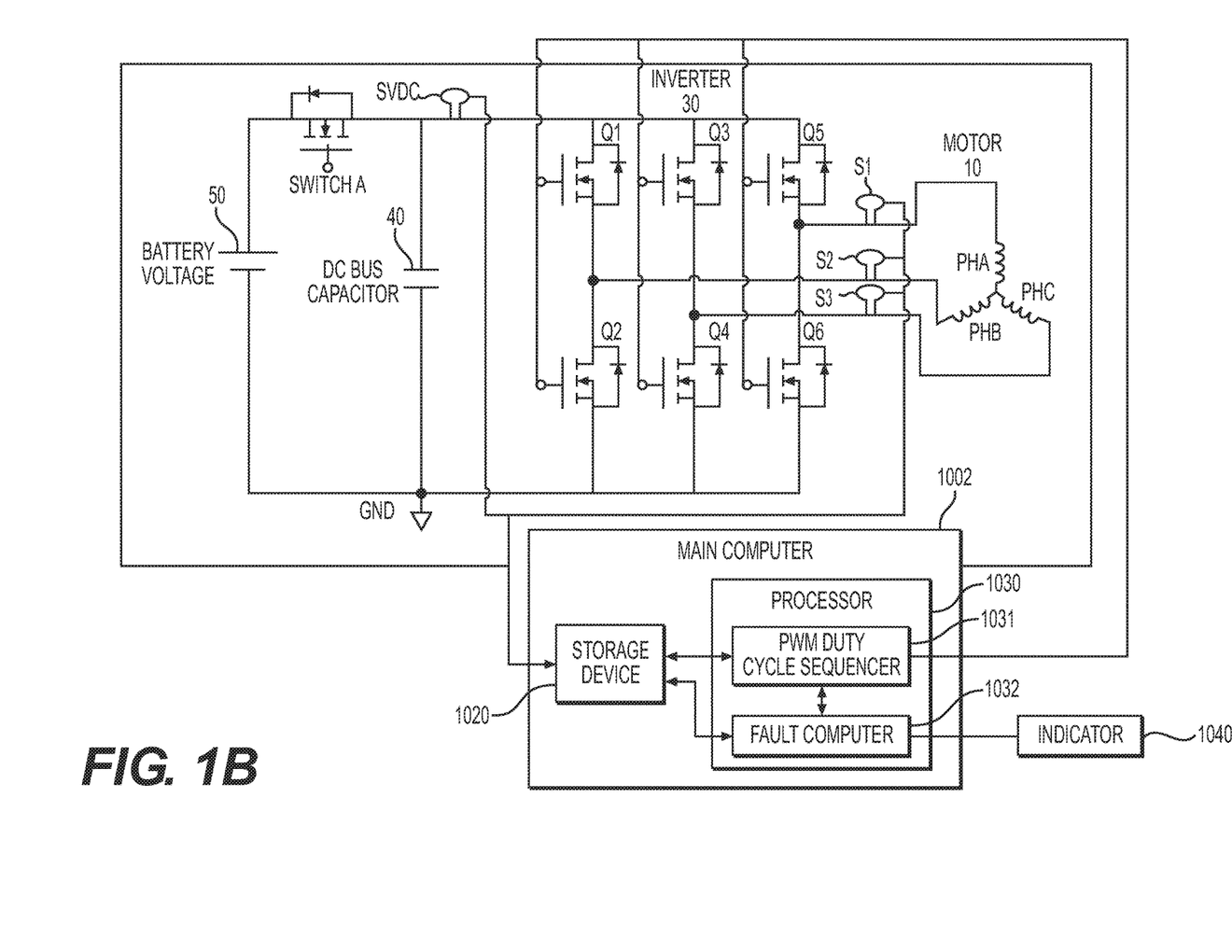
Figure 1C:
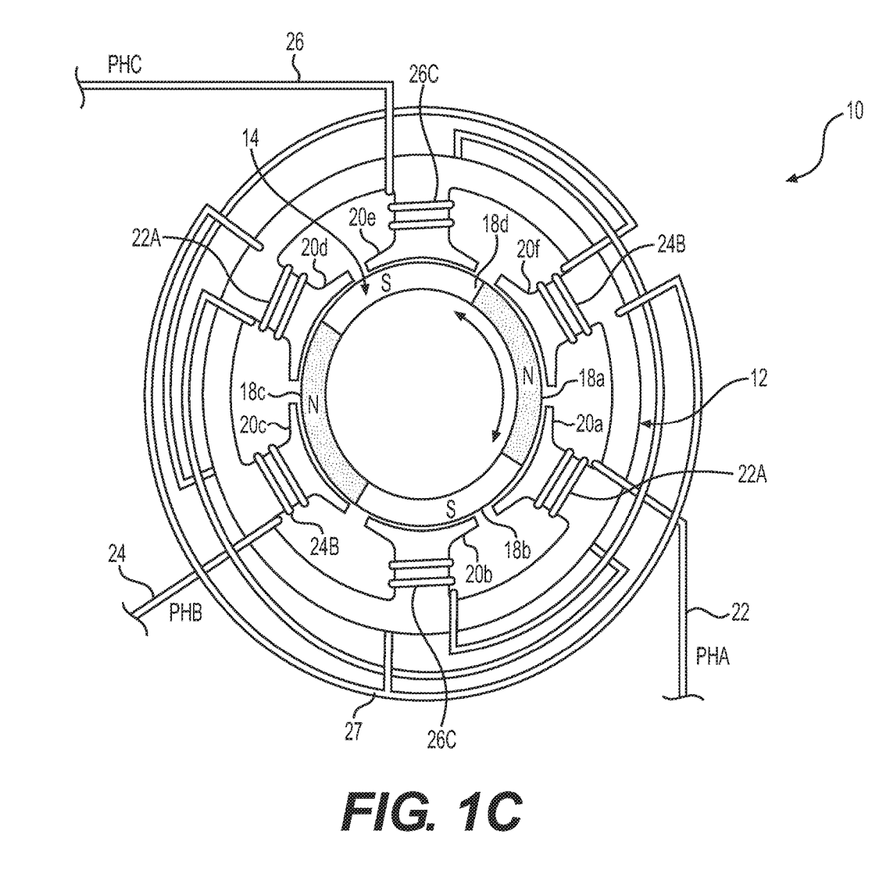
FIG. 1C is a representation of a three phase motor.

Electrical motor coil short detection and protection is desired in high vibration environments. The technique is applicable to any type of electric motor. For purposes of discussion, a brushless DC motor (BLDC) is shown to comprise a 3-phase permanent-magnet synchronous motor (PMSM) 10 with star connected stator 12. A schematic representation of the motor 10 is shown in FIGS. 1A & 1B, and a more detailed view is shown in FIG. 1C. The stator 12 can comprise a number of poles. In FIG. 1C, each of the three phases, first phase PHA, second phase PHB, third phase PHC comprises two poles, respectively 20a & 20d, 20c & 20f, and 20b & 20e. Other numbers of phases and pole pairings are alternatively possible to use with the aspects of this disclosure, for example a four phase motor having 8 paired poles.

Each of the first, second and third phases PHA, PHB, PHC has a respective dedicated wire 22, 24, 26 connected to an inverter 30 and coiled around respective poles 20a & 20d, 20c & 20f, and 20b & 20e to form coil windings 22A, 24B, & 26C. Ends of each of the wires 22, 24, 26 meet at the star connection 27.

Stator 12 surrounds a rotor 14. Rotor can rotate in a single direction or be reversible to rotate as indicated by the double-headed arrow in FIG. 1C. Rotor 14 can comprise permanent magnets arranged to form rotor poles 18a, 18b, 18c, & 18d. The coil windings 22A, 24B, 26C can be energized to rotate the rotor. A commutation algorithm can be executed by main computer 1002 so that the inverter 30 is controlled to energize the coil windings in sequences that control the rate and timing of rotation of the rotor 14. Any commutation sequence known in the art can be applied.

The inverter 30 can comprise an H-bridge inverter, as shown, with MOSFETs Q1-Q6. The MOSFETs are N-type, though a combination of N-type and P-type is an acceptable alternative, as is the use of diodes, among others. The gates of the MOSFETs are controlled to execute pulse width modulated (PWM) duty cycles and to control which MOSFET pairings are activated for phase (PHA, PHB, PHC) energization. The inverter can be connected to a DC BUS capacitor 40. The capacitor can be used to control the signal on the gates of the MOSFET for such techniques as bootstrapping. An additional N-type MOSFET is included as SWITCH A for optional reverse batter protection of the voltage source. In this example, the voltage source is a battery 50. Other circuit protectors, snubbers, filters etc. are omitted for clarity but can be included based on the application. A sink, or ground GND is shown.

A DC BUS voltage sensor $S_{VDC}$ is shown on a BUS running between the reverse batter protection SWITCH A and the inverter 30. Voltage sensor $S_{VDC}$ can be used to detect the voltage accurately to avoid an estimation process. In FIG. 1A, current sensors S1, S2, S3 are located between the inverter 30 and ground GND. In FIG. 1B, current sensors S1, S2, S3 are located at or near the coil windings 22A, 24B, 26C or at or near the circuit board for the inverter, and between the stator and the inverter. Current sensors S1, S2, S3 collect current measurements I1, I2, I3 and transmit them to a fault computer 1032. Using the direct measurement techniques disclosed herein avoids the lack of surety in prior art estimation schemes.

Fault computer 1032 can be a discrete device or part of main computer 1002, or part of a larger electronic control unit (ECU) or linked to communicate with the main computer 1002 or ECU. Fault computer 1032, main computer 1002, and ECU can comprise one or more storage devices and one or more processors, which can comprise allocation programming or distributed processing devices. For the drawn examples, fault computer 1032 is part of main computer 1002.

A storage device 1020 receives and stores data such as currents I1, I2, I3, direct current voltage VDC, difference values D1, D2, D3, first and second thresholds T1, T2, line-to-line resistances R1, R2, R3, resistance differences $\Delta R$, average resistance difference $\Delta R_{AVG}$, among others. Algorithms for executing the methods described herein can also be stored in the storage device 1020. The algorithms can be accessed and executed by processor 1030. Processor can comprise at least a pulse width modulated (PWM) duty cycle sequencer 1031 for controlling the duty cycles on the MOSFETs of the inverter 30, as by being connected to the gates of the MOSFETs. Fault computer 1032 can determine faults by comparing sensed and stored data to thresholds as discussed in more detail below. If no fault is determined, processor 1030 can set an operation status and storage device 1020 can store it, and the PWM duty cycle sequencer 1031 can sequence the duty cycles and operate the motor system nominally. If a fault is detected, then the fault sequencer can determine the severity of the fault and select between a disabled motor mode, wherein the motor system operation is terminated, and a degraded motor operation mode, wherein the motor operation is limited to less than its nominal capacity. The severity and presence of a fault condition or the presence of a no fault condition can be transmitted to an indicator 1040, such as a check motor light, on-board diagnostics (OBD) transmitter, or other fault message system. If the degraded motor operation mode is selected, the PWM duty cycle sequencer 1031 can modify the duty cycle signals transmitted to the coil windings 22A, 24B, 26C to limit the operability of the motor. For example, the degraded motor operation mode can limit the speed (rotations per minute) of the rotor to avoid a high heat condition or a high vibration condition.

Such motor systems 11A, 11B can be used on electric clutch actuators, hybrid electric transmissions, among other applications.

Figure 2:
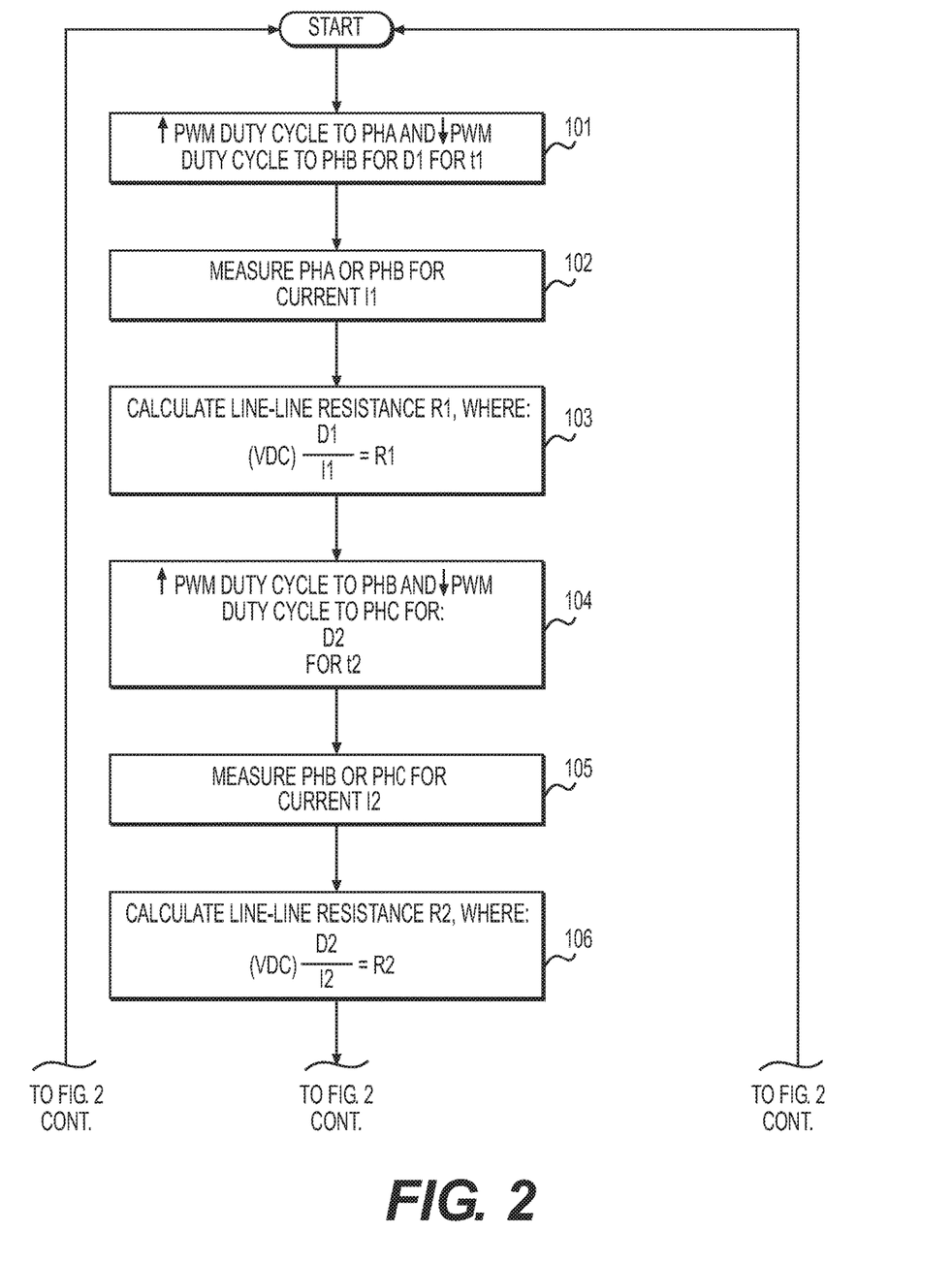
FIG. 2 is a flow diagram for a method of fault detection.

FIG. 2 outlines fault detection methods. As outlined in the flow diagram, in step 101, a known pulse width modulated (PWM) signal with a known first duty cycle is applied to coil winding 22A, corresponding to Phase A (PHA) of the three-phase motor. The duty cycle can be higher than a nominal duty cycle signal or any value higher than that applied to coil winding 24B, which corresponds to Phase B (PHB). The duty cycle applied to second coil winding 24B can be lower than nominal. The second duty cycle differs from the first duty cycle by a first difference value D1. The disparate duty cycles can be applied for a first duration of time, $t_1$. The duration to time $t_1$ can be, for example, 1 second. In a nominal system, the current flows through PHA and I PHB, with the current polarity being opposite to each other, in response to the PWM signal. The current rises and falls in a predictable manner. In a degrading system, the current rises when the resistance value decreases, as from ordinary wear. In a shorted system, the resistance is low, and the current is outside nominal to a marked degree.

To differentiate between these conditions, the current is measured by one of current sensors S1, S2. So, step 102 measures a first current I1 for one of the first phase coil windings 22A having the first duty cycle applied or for the second phase coil windings 24B having the second duty cycle applied.

The direct current voltage VDC can be measured directly via DC BUS voltage sensor $S_{VDC}$. The measured DC BUS voltage sensor $S_{VDC}$ can be used to continuously monitor the direct current voltage VDC at various times t1, t2, t3, etc. This allows the system to account for power surges or other fluctuations as they occur. Or, the direct current voltage VDC can be measured and re-measured less frequently, such as at system start up or shut down, with storage of the measurements in storage device 1020.

The direct current voltage VDC is used to calculate a first line-to-line resistance R1 between the first phase coil windings 22A and the second phase coil windings 24B. When considering phases PHA, PHB, PHC, it is also convenient to use the nomenclature RAB for the first line-to-line resistance. The first difference value D1, the measured first current I1, and the measured direct current voltage VDC are used according to:

$$R1 = (VDC) * \Delta D_1 / I_1 \qquad \text{eq. 1}$$

The process is repeated to calculate line-to-line resistances for the other phase pairings of the coil windings. When considering phases PHA, PHB, PHC, it is convenient to use the nomenclature RCA and RBC for the remaining line-to-line resistances. The order in which the line-to-line resistances are calculated is not important, so long as a relative comparison is possible to determine a difference between the resistances on the coil windings 22A, 24B, 26C or their affiliated circuitry.

The method of FIG. 2 proceeds to determine the line-to-line resistance RBC next. So, in step 104, a third pulse width modulated signal having a third duty cycle is applied to the third phase coil windings 26C (PHC) of the plural coil windings of the three-phase motor. In this example, the duty cycle is decreased relative to the fourth duty cycle, and this can comprise a duty cycle less than nominal. A fourth pulse width modulated signal having a fourth duty cycle can be applied to one of the first phase coil windings 22A or to the second phase coil windings 24B. In the illustration, the fourth duty cycle is applied to the second phase coil windings 24B (PHB), and the fourth duty cycle is higher than nominal, or at least higher than the third duty cycle. The fourth duty cycle differs from the third duty cycle by a second difference value D2.

One of current sensors S1, S2, S3 is used to measure a second current I2 for one of the third phase coil windings 26C having the third duty cycle applied or for the one of the first phase coil windings 22A or the second phase coil windings 24B having the fourth duty cycle applied thereon. As illustrated is step 106, one of sensors S2, S3 is used to measure second current on either the third phase coil windings 26C or the second phase coil windings 24B. A fault in the motor or its related circuitry can be detected based on the measurements.

The second current I2 can be measured at a second time t2. The duration of t1 can equal the duration of t2, but the measurement is made at a time when the first duty cycle and second duty cycle are not applied. The second current I2 is measured when third phase coil windings are having the third duty cycle applied thereon and when the first phase coil windings or the second phase coil windings are having the fourth duty cycle applied thereon. As above, a new DC BUS voltage VDC can be measured at time t2 or a stored value can be recalled so that at step 106, the processor 1030 can calculate a second line-to-line resistance R2.

As illustrated, second line-to-line resistance R2 between the third phase coil windings 26C and the second phase coil windings 24B is calculated. Though, the first phase coil windings 22A could be studied for faults prior to studying the second phase coil windings 24B. The calculation is done according to:

$$R2=(VDC)*D2/I2 \qquad \text{eq. 2.}$$

It is possible to detect a fault condition with just the two phase coil windings analyzed in this manner. It is possible to determine a resistance difference ΔR between the calculated first line-to-line resistance R1 and the calculated second line-to-line resistance R2. When the resistance difference ΔR is compared to a first non-zero threshold T1, the difference can be large enough to indicate a short or other fault. So, when the resistance difference ΔR deviates from the first threshold T1, it is possible to set a fault for the motor system 11A, 11B. Also, the first non-zero threshold T1 can be selected to allow a range of resistance differences ΔR to be determined and compared without setting a fault for the motor system. Using a range of passing values can permit minor resistance differences ΔR due to system tolerances or due to minor issues that are within the rated capacity of the motor system.

However, to check the third phase of the three phase motor, and to know the fault status of the motor system for all three phases PHA, PHB, PHC, the process of FIG. 2 proceeds to step 107. The fourth pulse width modulated signal having the fourth duty cycle has been applied to the second phase coil windings 24B at time t2. Now, at time t3, which is different from times t1 & t2, the method further comprises applying a fifth pulse width modulated signal having a fifth duty cycle to the first phase coil windings 22A. The fifth duty cycle can be lower than nominal. A sixth pulse width modulated signal having a sixth duty cycle is applied to the third phase coil windings 26C. The sixth duty cycle can be higher than nominal, or at least higher than the fifth duty cycle. The sixth duty cycle differs from the fifth duty cycle by a third difference value D3.

During time t3, at step 108, a third current I3 is measure by current sensor S1 or S3 for one of the first phase coil windings 22A having the fifth duty cycle applied or for the third phase coil windings 26C having the sixth duty cycle applied thereon. The duration of time t3 can be the same as the durations for times t1 & t2.

A third line-to-line resistance R3 is calculated in step 109 between the first phase coil windings 22A having had the fifth duty cycle applied and the third phase coil windings 26C having had the sixth duty cycle applied thereon. The third difference value D3, the measured third current I3, and the measured direct current voltage VDC are used according to:

$$R3=(VDC)*D3/I3 \qquad \text{eq. 3.}$$

As with the other line-to-line resistance calculations, the measured direct current voltage VDC can be accessed from storage or measured anew during time t3.

The illustrated process compares the first line-to-line resistance R1, the second line-to-line resistance R2, and the third line-to-line resistance R3 to one another in step 110. The comparison detects whether one of the first phase coil windings 22A, the second phase coil windings 24B, or the third phase coil windings 26C comprise a low resistance condition relative to one another. A low resistance on one of the phases PHA, PHB, PHC relative to the others can indicate a short or other fault, or system degradation.

Comparing R1, R2, R3 (RAB, RBC, RCA) against each other indicates whether there is a resistance difference ΔR between them, as in step S110. If any of the phase coils are shorted, the resistance of that phase coil will be smaller. The two of the line-to-line resistances of which the shorted phase coil is a part of will calculate smaller than the remaining line-to-line resistance comprising the two non-shorted phase coils. So, if Phase A PHA is shorted, then the line-to-line resistances RAB & RCA will show a smaller over-all resistance than the line-to-line resistance RBC. With smaller resistance comes higher current. If Phase A PHA is open circuit, then the current will be low and the resistance will be high. And so, as below, the current in the system can indicate faults such as shorts and open circuits. The resistance difference ΔR can indicate which two line-to-line resistances comprise the faulty phase coil, and it can be solved which to of the phases PHA, PHB, PHC comprise nominal phase coil windings. This fault detection technique is based on a relative comparison, and so it does not need individual phase voltage sensing. Instead of an elaborate layout, and instead of complex estimations, a DC bus voltage measurement and phase current measurements will be sufficient to determine the presence and extent of a fault for appropriate protective action determination.

A predefined first threshold T1 is used to determine if ΔR is greater than first threshold T1, as in decision step 111. If so, a fault is indicated in step 113 after checking iterations in step 112. A number of iterations can be tracked in step 112 to ensure an adequate number of test cycles have been run to be definitive that there is a fault. The motor drive can be disabled in step 115 or operated in a degraded mode in step 114. The process can repeat to confirm if the resistance difference ΔR is greater than the first threshold T1 for a second iteration, so as to avoid a disabled mode or a degraded mode over a temporary glitch.

So, in step 112, the method can further comprise iterating the method to accumulate a quantity of resistance differences ΔR. These can be used to calculate an average resistance difference $\Delta R_{AVG}$. A fault can be set only after a certain number of iterations yield results indicative of a fault. So, a fleeting power surge or power drop will not result in a fault. A second threshold T2 can be used to determine what the average resistance difference should be across the iterations to meaningfully indicate a fault. So, setting the fault for the motor system occurs only after the calculated average resistance difference $\Delta R_{AVG}$ exceeds the second threshold T2.

Another way to affirm whether a fault is fleeting or permanent is to iterate the method for a certain number of cycles. With each new iteration, it is possible to vary one or more of the first duty cycle, the second duty cycle, the third duty cycle, the fourth duty cycle, the fifth duty cycle or the sixth duty cycle from the prior iteration. This will vary the difference values D1, D2, D3 and the measured currents I1, I2, I3. But, the line-to-line resistances R1, R2, R3 should remain the same across the readings. So, if a fault is detected, it will appear in step 110 and 111, as the resistance difference ΔR will continue to occur with each iteration.

A further option can be added to check for normal wear-out of the components. This appears in step 116, where one or more of the calculated first line-to-line resistance R1, the calculated second line-to-line resistance R2, and the calculated third line-to-line resistance R3 are compared for deviations from a nominal line-to-line resistance RN. The nominal line-to-line resistance RN can permit a range of calculated values to pass the fault check without setting a fault in step 113. A new, non-degraded system will have a lifespan. Over time, it will degrade, but will still be safe to operate. Setting a nominal line-to-line resistance RN can permit a fault setting once the lifespan is spent. Or, prior to the lifespan being spent, a signal can be sent saying that service will be due soon, thus avoiding degraded or disabled modes. So, it is possible to determine whether the calculated first line-to-line resistance R1 and the calculated second line-to-line resistance R2 deviate from the nominal line-to-line resistance RN, and to set a fault when either of the calculated first line-to-line resistance R1 and the calculated second line-to-line resistance R2 deviate from the nominal line-to-line resistance RN. To permit the passing of ordinary or acceptable wear, the nominal line-to-line resistance can comprise a range of acceptable line-to-line resistance values.

Yet another option comprises comparing the measured first current I1 and the measured second current I2 to a threshold current TC to determine a deviation from the threshold current TC. The threshold current can be a single value. Or, the threshold current TC can be a range of values so that, as above, normal lifespan can be differentiated from a faulty wear-out condition. Iterative concepts from above can be applied here, also. When one of the measured first current I1 or the measured second current I2 exceed the threshold current TC, processor 1030 and fault computer 1032 can set a fault indicative of an open circuit.

An open circuit can also be detected when comparing the resistance difference ΔR to a first non-zero threshold T1. Or, by comparing the line-to-line resistances R1, R2, R3 to the nominal resistance RN. If absolute values are used, a resistance difference ΔR can indicate a short circuit or a fault, but if sign placement is used, a deviation in one direction from the threshold T1 or resistance difference ΔR will indicate a short circuit, while a deviation of the opposite sign will indicate an open circuit. This is because a high resistance and low current indicates an open circuit while a low resistance and high current indicates a short circuit.

Other implementations will be apparent to those skilled in the art from consideration of the specification and practice of the examples disclosed herein.

What is claimed is:

1. A method of detecting a fault in a motor system, the motor system comprising a direct current source, an inverter, a bus between the source and the inverter, and a multi-phase motor comprising plural coil windings on a stator, the method comprising:
   applying a first pulse width modulated signal having a first duty cycle to first phase coil windings of the plural coil windings;
   applying a second pulse width modulated signal having a second duty cycle to second phase coil windings of the plural coil windings, where the second duty cycle differs from the first duty cycle by a first difference value (D1);
   measuring a first current (I1) for one of the first phase coil windings having the first duty cycle applied or for the second phase coil windings having the second duty cycle applied;
   applying a third pulse width modulated signal having a third duty cycle to third phase coil windings of the plural coil windings;
   applying a fourth pulse width modulated signal having a fourth duty cycle to one of the first phase coil windings or to the second phase coil windings, where the fourth duty cycle differs from the third duty cycle by a second difference value (D2);
   measuring a second current (I2) for one of the third phase coil windings having the third duty cycle applied or for the one of the first phase coil windings or the second phase coil windings having the fourth duty cycle applied thereon;
   measuring a direct current voltage (VDC) on the bus;
   calculating a first line-to-line resistance (R1) between the first phase coil windings and the second phase coil windings using the first difference value (D1), the measured first current (I1), and the measured direct current voltage (VDC);
   calculating a second line-to-line resistance (R2) between the third phase coil windings and the one of the first phase coil windings or the second phase coil windings having had the fourth duty cycle applied thereon using the second difference value (D2), the measured second current (I2), and the measured direct current voltage (VDC);
   determining a resistance difference (ΔR) between the calculated first line-to-line resistance (R1) and the calculated second line-to-line resistance (R2);
   comparing the resistance difference (ΔR) to a first non-zero threshold (T1); and
   when the resistance difference (ΔR) deviates from the first threshold (T1), setting a fault for the motor system.

2. The method of claim 1, further comprising iterating the method of claim 1 to accumulate a quantity of resistance differences (ΔR); calculating an average resistance difference ($\Delta R_{AVG}$) using the accumulated quantity of resistance differences (ΔR); and setting the fault for the motor system after the calculated average resistance difference ($\Delta R_{AVG}$) exceeds a second threshold (T2).

3. The method of claim 1, further comprising iterating the method of claim 1 and with each new iteration, varying one or more of the first duty cycle, the second duty cycle, the third duty cycle, or the fourth duty cycle from the prior iteration.

4. The method of claim 1, wherein the first duty cycle is greater than the second duty cycle, and wherein the third duty cycle is less than the fourth duty cycle.

5. The method of claim 1, wherein the motor is a three-phase motor, wherein the fourth pulse width modulated signal having the fourth duty cycle is applied to the second phase coil windings, the method further comprising:
   applying a fifth pulse width modulated signal having a fifth duty cycle to the first phase coil windings;
   applying a sixth pulse width modulated signal having a sixth duty cycle to the third phase coil windings, where the sixth duty cycle differs from the fifth duty cycle by a third difference value (D3);
   measuring a third current (I3) for one of the first phase coil windings having the fifth duty cycle applied or for the third phase coil windings having the sixth duty cycle applied thereon;
   calculating a third line-to-line resistance (R3) between the first phase coil windings having had the fifth duty cycle applied and the third phase coil windings having had the sixth duty cycle applied thereon using the third difference value (D3), the measured third current (I3), and the measured direct current voltage (VDC);
   comparing the first line-to-line resistance (R1), the second line-to-line resistance (R2), and the third line-to-line resistance (R3) to one another to detect whether one of the first phase coil windings, the second phase coil windings, and the third phase coil windings comprise a low resistance condition relative to the plural coil windings.

6. The method of claim 5, wherein calculating the third line-to-line resistance (R3) comprises multiplying the measured direct current voltage (VDC) by the third difference value (D3) divided by the third current (I3) according to (VDC)*D3/I3.

7. The method of claim 1, wherein calculating the first line-to-line resistance (R1) comprises multiplying the measured direct current voltage (VDC) by the first difference value (D1) divided by the first current (I1) according to (VDC)*D1/I1.

8. The method of claim 1, wherein the first current (I1) is measured at or near the first phase coil windings or at or near the second phase coil windings and between the stator and the inverter.

9. The method of claim 1, wherein the motor system further comprises a ground connection, wherein the first current is measured between the inverter and the ground connection.

10. The method of claim 1, further comprising:
comparing the calculated first line-to-line resistance and the calculated second line-to-line resistance to a nominal line-to-line resistance;
determining whether the calculated first line-to-line resistance and the calculated second line-to-line resistance deviate from the nominal line-to-line resistance; and
setting a fault when either of the calculated first line-to-line resistance and the calculated second line-to-line resistance deviate from the nominal line-to-line resistance.

11. The method of claim 10, wherein the nominal line-to-line resistance comprises a range of resistance values, and wherein determining that the calculated first line-to-line resistance and the calculated second line-to-line resistance deviate from the nominal line-to-line resistance indicates a wear-out condition of the motor system.

12. The method of claim 1, wherein comparing the resistance difference ($\Delta R$) to a first non-zero threshold (T1) detects a short in the motor system.

13. The method of claim 1, wherein comparing the resistance difference ($\Delta R$) to a first non-zero threshold (T1) detects an open circuit in the motor system.

14. The method of claim 1, wherein the first non-zero threshold (T1) is selected to allow a range of resistance differences ($\Delta R$) to be determined and compared without setting a fault for the motor system.

15. The method of claim 1, further comprising comparing the measured first current (I1) and comparing the measured second current (I2) to a threshold current (TC) to determine a deviation from the threshold current (TC); and when one of the measured first current (I1) or the measured second current (I2) exceed the threshold current (TC), setting an open circuit fault.

16. The method of claim 1, further comprising selecting between a disabled motor mode, wherein the motor operation is terminated, and a degraded motor operation mode, wherein the motor operation is limited to less than a nominal capacity.

* * * * *